United States Patent
Ogasawara

(10) Patent No.: US 7,351,665 B2
(45) Date of Patent: Apr. 1, 2008

(54) PLASMA ETCHING METHOD, PLASMA ETCHING APPARATUS, CONTROL PROGRAM, COMPUTER RECORDING MEDIUM AND RECORDING MEDIUM HAVING PROCESSING RECIPE RECORDED THEREON

(75) Inventor: Masahiro Ogasawara, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/390,449

(22) Filed: Mar. 28, 2006

(65) Prior Publication Data

US 2006/0213616 A1    Sep. 28, 2006

Related U.S. Application Data

(60) Provisional application No. 60/666,697, filed on Mar. 31, 2005.

(30) Foreign Application Priority Data

Mar. 28, 2005    (JP) ............................. 2005-091580

(51) Int. Cl.
*H01L 21/302*    (2006.01)
(52) U.S. Cl. ...................... 438/714; 438/700; 438/723; 438/734; 438/743
(58) Field of Classification Search ................ 437/700, 437/714, 723, 734, 743
See application file for complete search history.

(56) References Cited

U.S. PATENT DOCUMENTS 6,620,741 B1 *   9/2003  Gracias et al. .............. 438/780
6,660,652 B2 * 12/2003  Kim et al. ................... 438/734

FOREIGN PATENT DOCUMENTS

| JP | 2000-150413 | 5/2000 |
| JP | 2002-141336 | 5/2002 |
| KR | 2001-004177 | * 1/2001 |

* cited by examiner

Primary Examiner—George A. Goudreau
(74) Attorney, Agent, or Firm—Oblon, Spivak, McClelland, Maier & Neustadt, P.C.

(57) ABSTRACT

In a first step and a thirst step, etching gases are used which contain fluorocarbon gases having C/F atom number ratios higher than that in a second step. A hole is formed to a midpoint in a silicon oxide film in the first step, the hole is formed until a base SiN film begins to be exposed or immediately before it is exposed in the second step, and overetching is performed in the third step. This enables even a hole having a fine diameter and a high aspect ratio to be formed in an excellent shape.

5 Claims, 4 Drawing Sheets

US 7,351,665 B2

PLASMA ETCHING METHOD, PLASMA ETCHING APPARATUS, CONTROL PROGRAM, COMPUTER RECORDING MEDIUM AND RECORDING MEDIUM HAVING PROCESSING RECIPE RECORDED THEREON

CROSS-REFERENCE TO RELATED APPLICATION

This application is based upon and claims the benefit of priority from the prior Japanese Patent Application No. 2005-091580, filed on Mar. 28, 2005; and the prior U.S. Patent Provisional Application No. 60/666,697, filed on Mar. 31, 2005; the entire contents of which are incorporated herein by reference.

BACKGROUND OF THE INVENTION

1. Field of the Invention

The present invention relates to a plasma etching method of forming a hole by an etching process in a silicon oxide film through a mask, a plasma etching apparatus, a control program, a computer recording medium, and a recording medium having a processing recipe recorded thereon.

2. Description of the Related Art

Conventionally, in a manufacturing process of semiconductor devices, holes such as contact holes have been formed in a silicon oxide film by plasma etching. In such a process of forming the contact holes, so-called bowing is apt to occur in which the shape of the side wall in the hole bulges outward, and therefore it is required to restrain the occurrence of such bowing so as to make the side wall shape almost vertical.

As a plasma etching method of forming the above-described contact hole, two-step etching is known in which main etching is performed using, for example, an etching gas composed of a mixed gas of $CHF_3/CO/Ar$, and then overetching is performed using an etching gas composed of a mixed gas of $C_4F_8/CO/O_2/Ar$. In other words, in this two-step etching, the main etching is performed using a hydro-fluorocarbon gas under conditions where etching easily proceeds at the bottom of the contact hole but the contact hole is formed in a tapered shape, and thereafter the overetching is performed using a fluorocarbon gas under conditions where etch-stop is apt to occur at the bottom of the contact hole but the contact hole is formed in a vertical shape, thereby keeping the side wall shape of the contact hole vertical as much as possible (see, for example, Japanese Patent Laid-open Application No. 2000-150413)

As a plasma etching method of forming contact holes, for example, two-step etching is also known in which main etching is performed using an etching gas composed of a mixed gas of $C_4F_8/Ar/O_2/(CH_2F_2$ or $CHF_3)$, and then overetching is performed using an etching gas composed of a mixed gas of $C_4F_8/Ar/CO$ (see, for example, Japanese Patent Application Laid-open No. 2002-141336).

With miniaturization of semiconductor devices, the diameter of the contact hole and the like are apt to become smaller, and its aspect ration is apt to increase. Specifically, it is required to form a hole with a hole diameter of, for example, 0.13 µm or smaller and an aspect ratio of, for example, 15 or higher. Therefore, with the above-described conventional methods, it has been difficult to form a hole with a fine diameter and a high aspect ratio in an excellent shape, because of occurrence of phenomena such as occurrence of etch-stop, increase in bowing, or the like.

SUMMARY OF THE INVENTION

As described above, a problem of the conventional plasma etching method is that it is difficult to form a hole with a fine diameter and a high aspect ratio in an excellent shape in which the hole diameter is, for example, 0.13 µm or smaller and the aspect ratio is, for example, 15 or higher.

It is an object of the present invention to provide a plasma etching method capable of forming even a hole with a fine diameter and a high aspect ratio in an excellent shape, a plasma etching apparatus, a control program, a computer recording medium, and a recording medium having a processing recipe recorded thereon.

An aspect of the plasma etching method of the present invention is a plasma etching method of forming a hole by an etching process in a silicon oxide film through a mask, wherein an etching gas containing a fluorocarbon gas is used, and C/F (the number of carbon atoms/the number of fluorine atoms) ratios of a fluorocarbon gas used in an initial period of the etching process and a fluorocarbon gas used in a final period of the etching process are higher than a C/F ratio of a fluorocarbon gas used in an intermediate period of the etching process.

An aspect of the plasma etching method of the present invention is the above-described plasma etching method, wherein a diameter of the hole is 0.13 µm or smaller.

An aspect of the plasma etching method of the present invention is the above-described plasma etching method, wherein an aspect ratio of the hole is 15 or higher.

An aspect of the plasma etching method of the present invention is the above-described plasma etching method, wherein the fluorocarbon gas used in the initial period of the etching process and the fluorocarbon gas used in the final period of the etching process contain no hydrogen, and the C/F ratios of the fluorocarbon gases are 5/8 or higher.

An aspect of the plasma etching method of the present invention is the above-described plasma etching method, wherein the fluorocarbon gas used in the initial period of the etching process and the fluorocarbon gas used in the final period of the etching process contain no hydrogen, and the C/F ratios of the fluorocarbon gases are 2/3 or higher.

An aspect of the plasma etching method of the present invention is the above-described plasma etching method, wherein the fluorocarbon gas used in the initial period of the etching process and the fluorocarbon gas used in the final period of the etching process contain no hydrogen, and the C/F ratios of the fluorocarbon gases are 5/8 or higher and 2/3 or lower.

An aspect of the plasma etching method of the present invention is the above-described plasma etching method, wherein the fluorocarbon gas used in the intermediate period of the etching process contains no hydrogen, and the C/F ratio of the fluorocarbon gas is 1/2 or lower.

An aspect of the plasma etching method of the present invention is the above-described plasma etching method, wherein the etching gas contains a rare gas and oxygen in addition to the fluorocarbon gas.

An aspect of the plasma etching method of the present invention is the above-described plasma etching method, wherein the mask is made of amorphous carbon.

An aspect of the plasma etching method of the present invention is a plasma etching method of forming a hole with a hole diameter of 0.13 µm or smaller in a silicon oxide film formed on a silicon nitride film, including: a first step of etching the silicon oxide film to a midpoint using an etching gas containing $C_4F_6$ or $C_5F_8$; after the first step, a second step of etching the silicon oxide film using an etching gas containing $C_4F_8$; and after the second step, a third step of performing overetching using an etching gas containing $C_4F_6$ or $C_5F_8$.

An aspect of the plasma etching method of the present invention is the above-described plasma etching method, wherein the etching gases used in the first step and third step include a mixed gas of $C_4F_6$ or $C_5F_8$ and a rare gas and oxygen, and wherein the etching gas used in the second step includes a mixed gas of $C_4F_8$ and a rare gas and oxygen.

An aspect of the plasma etching apparatus of the present invention is a plasma etching apparatus, including: a processing container which houses an object to be processed; an etching gas supply means for supplying an etching gas into the processing container; a plasma generation means for making the etching gas supplied from the etching gas supply means into plasma to plasma-etch the object to be processed; and a control unit which conducts a control such that the above-described plasma etching method is performed in the processing container.

An aspect of the control program of the present invention is a control program operating on a computer controlling a plasma processing apparatus such that the above-described plasma etching method is performed at the time of execution of operation.

An aspect of the computer recording medium of the present invention is a computer recording medium which stores a control program operating on a computer, wherein the control program controls a plasma processing apparatus such that the above-described plasma etching method is performed at the time of execution of operation.

An aspect of the recording medium having a processing recipe recorded thereon of the present invention is a recording medium having a processing recipe recorded thereon, for controlling a plasma etching apparatus which forms a hole by an etching process in a silicon oxide film through a predetermined mask, the processing recipe including: a first etching process of performing etching using an etching gas containing a fluorocarbon gas; after the first etching process, a second etching process of performing etching using an etching gas containing a fluorocarbon gas; and after the second etching process, a third etching process of performing etching using an etching gas containing a fluorocarbon gas, wherein C/F (the number of carbon atoms/the number of fluorine atoms) ratios of the fluorocarbon gases used in the first and third etching processes are higher than a C/F ratio of the fluorocarbon gas used in the second etching process.

An aspect of the recording medium having a processing recipe recorded thereon of the present invention is a recording medium having a processing recipe recorded thereon, for controlling a plasma etching apparatus which forms a hole by an etching process in a silicon oxide film formed on a silicon nitride film through a predetermined mask, the processing recipe including: a first step of etching the silicon oxide film to a midpoint using an etching gas containing $C_4F_6$ or $C_5F_8$; after the first step, a second step of etching the silicon oxide film using an etching gas containing $C_4F_8$; and after the second step, a third step of performing overetching using an etching gas containing $C_4F_6$ or $C_5F_8$.

DESCRIPTION OF THE EMBODIMENTS

Figure 1A:
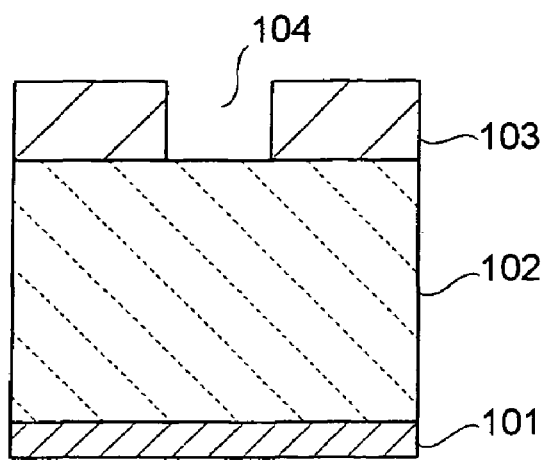
FIGS. 1A to 1D are views showing cross-sectional structures of a semiconductor wafer relating to an etching method of an embodiment of the present invention.

Hereinafter, an embodiment of the present invention will be described with reference to the drawings. FIGS. 1A to 1D show enlarged cross-sectional structures of a semiconductor wafer W according to the embodiment, and FIG. 2 shows a configuration of a plasma etching apparatus according to the embodiment. The configuration of the plasma etching apparatus is described first with reference to FIG. 2.

The plasma etching apparatus 1 is a capacitive-coupling type parallel plate etching apparatus in which electrode plates are opposed to and in parallel with each other one above the other with one of the electrodes being connected with a plasma forming power supply. The plasma etching apparatus 1 has a chamber (processing container) 2 formed in a circular cylindrical shape made of, for example, aluminum or the like with yttria sprayed on its surface, the chamber 2 being grounded. A substantially circular cylindrical susceptor supporting table 4 is provided at a bottom in the chamber 2 with an insulating plate 3 intervening therebetween, for mounting an object to be processed, for example, a semiconductor wafer W thereon. Further, on the susceptor supporting table 4, a susceptor 5 is provided which constitutes a lower electrode. To the susceptor 5, a high pass filter (HPF) 6 is connected.

Inside the susceptor supporting table 4, a refrigerant chamber 7 is provided. Into the refrigerant chamber 7, a refrigerant is introduced via a refrigerant introducing pipe 8 and circulated, so that the cold heat of the refrigerant is transferred via the susceptor 5 to the semiconductor wafer W. This controls the semiconductor wafer W to a desired temperature.

The susceptor 5 is formed such that its upper central portion is formed in a projecting circular disc shape on which an electrostatic chick 11 having almost the same shape as that of the semiconductor wafer W is provided. The electrostatic chuck 11 is made of an insulating-material with an electrode 12 disposed therein. A direct-current voltage of, for example, 1.5 kV is then applied from a direct-current power supply 13 connected to the electrode 12 to electrostatically attract the semiconductor wafer W, for example, by Coulomb force.

The insulating plate 3, the susceptor supporting table 4, the susceptor 5, and the electrostatic chuck 11 are formed with a gas passage 14 for supplying a heat-transfer medium (for example, He gas or the like) to the rear surface of the semiconductor wafer W. Via the heat-transfer medium, the cold heat of the susceptor 5 is transferred to the semiconductor wafer W to keep the semiconductor wafer W at a predetermined temperature.

At the peripheral portion of the upper end of the susceptor 5, an annular focus ring 15 is located to surround the semiconductor wafer W mounted on the electrostatic chuck 11. The focus ring 15 is made, for example, of a conductive material such as silicon, and has a function to improve the uniformity of etching.

Above the susceptor 5, an upper electrode 21 is provided opposed to and in parallel with the susceptor 5. The upper electrode 21 is supported by an upper portion of the chamber 2 via an insulating material 22. The upper electrode 21 is composed of an electrode plate 24, which is made of aluminum with its surface being subjected to anodic oxidization treatment (alumite treatment) and is provided with a quartz cover and which constitutes an opposed surface to the susceptor 5 and has a number of discharge holes 23, and an electrode supporter 25 made of a conductive material which supports the electrode 24. The susceptor 5 and the upper electrode 21 are configured such that a distance therebetween is changeable.

A gas introducing port 26 is provided at the center of the electrode supporter 25 in the upper electrode 21, and a gas supply pipe 27 is connected to the gas introducing port 26. Further to the gas supply pipe 27, a processing gas supply source 30 is coupled via a valve 28 and a mass-flow controller 29. From the processing gas supply source 30, an etching gas for plasma etching is supplied. In the embodiment, from the processing gas supply source 30, at least two kinds of etching gasses, that is, an etching gas comprising $C_4F_6/Ar/O_2$ and an etching gas comprising $C_4F_8/Ar/O_2$.

An exhaust pipe 31 is connected to the bottom of the chamber 2, and an exhauster 35 is connected to the exhaust pipe 31. The exhauster 35 comprises a vacuum pump such as a turbo molecule pump and can evacuate the chamber 2 to a predetermined reduced pressure atmosphere, for example, a predetermined pressure equal to or lower than 1 Pa. Further, a gate valve 32 is provided on a side wall of the chamber 2 so that the semiconductor wafer W is carried to/from an adjacent load lock chamber (not shown) with the gate valve 32 opened.

A first high-frequency power supply 40 is coupled to the upper electrode 21, and a matching device 41 is interposed in its power supply line. Further, a low pass filter (LPF) 42 is connected to the upper electrode 21. The first high-frequency power supply 40 has frequencies within a range from 13 MHz to 150 MHz. Application of such a high frequency allows high-density plasma to be formed in a preferable dissociation state in the chamber 2. It is preferable that the frequencies of the first high-frequency power supply 40 range from 13 MHz to 80 MHz, and therefore a frequency of 60 MHz illustrated is used in a later-described embodiment.

A second high-frequency power supply 50 is coupled to the susceptor 5 as the lower electrode, and a matching device 51 is interposed in its power supply line. The second high-frequency power supply 50 has frequencies within a range lower than that of the first high-frequency power supply 40, so that application of a frequency in such range allows an appropriate ion action to be provided to the semiconductor wafer W that is the object to be processed without damage thereto. It is preferable that the frequencies of the second high-frequency power supply 50 range from 1 MHz to 20 MHz, and therefore a frequency of 2 MHz illustrated is used in the later-described embodiment.

The action of the plasma etching apparatus 1 configured as described above is comprehensively controlled by a control unit 60. The control unit 60 has a process controller 61 which includes a CPU to control the units and devices in the plasma etching apparatus 1, a user interface 62, and a memory part 63 provided therein.

The user interface 62 is constituted of a keyboard through which a process manager performs operation of inputting commands to manage the plasma etching apparatus 1, a display which displays the operating state of the plasma etching apparatus 1, and so on.

The memory part 63 stores recipes in which a control program (software), processing condition data and so on are stored for realizing various kinds of processing performed in the plasma etching apparatus 1 by control of the process controller 61. Then, any of the recipes is called from the memory part 63 under an instruction through the user interface 62 or the like when necessary, and then executed by the process controller 61, so that predetermined processing is performed in the plasma etching apparatus 1 under the control of the process controller 61. Further, as the recipe including the control program, the processing condition data, and so on, one stored in a computer readable computer recording medium (for example, a hard disk, CD, flexible disk, semiconductor memory, or the like) can be used, or one that is transmitted as needed from another apparatus, for example, via an dedicated line can be used on-line.

When a silicon oxide film (TEOS film) formed on the semiconductor wafer W is etched by the plasma etching apparatus 1 having the above described configuration, the semiconductor wafer W is first carried from the not-shown load lock chamber into the chamber 2 after the gate valve 32 is opened, and then mounted on the electrostatic chuck 11. The direct-power supply 13 applies the direct-current voltage to the electrostatic chuck 11, whereby the semiconductor wafer W is electrostatically attracted onto the electrostatic chuck 11. Subsequently, the gate valve 32 is closed, and the exhauster 35 evacuates the chamber 2 to a predetermined degree of vacuum.

Thereafter, the valve 28 is opened so that a predetermined etching gas is introduced from the processing gas supply source 30 with its flow rate being adjusted by the mass-flow controller 29, passing through the processing gas supply pipe 27 and the gas introducing port 26 into the hollow portion in the upper electrode 21, and further passing through the discharge holes 23 in the electrode plate 24 being uniformly discharged to the semiconductor wafer W as shown by arrows in FIG. 2.

Then the pressure in the chamber 2 is maintained at a predetermined pressure. Thereafter, a high-frequency power with a predetermined frequency is applied from the first high-frequency power supply 40 to the upper electrode 21. This causes a high-frequency electric field between the upper electrode 21 and the susceptor 5 as the lower electrode to dissociate the etching gas into plasma.

On the other hand, a high-frequency power with a frequency lower than that of the above-described first high-frequency power supply 40 is applied from the second high-frequency power supply 50 to the susceptor 5 that is the lower electrode. This draws ions in the plasma into the susceptor 5 side, so that ion assist enhances the anisotropy of the etching.

After completion of the predetermined etching processing, the supply of the high-frequency powers and the supply of the etching gas are then stopped, and the semiconductor wafer W is carried out of the chamber 2 in a procedure reverse of the above described procedure.

Next, referring to FIGS. 1A to 1D, a plasma etching method according to the embodiment will be described. As shown in FIG. 1A, on the surface of the semiconductor wafer W as the object to be processed, a SiN film 101, a silicon oxide film (for example, TEOS film) 102, and an amorphous carbon film (mask) 103 are formed in order from the bottom. The uppermost amorphous carbon film (mask) 103 is formed with an opening 104 for forming a contact hole with a predetermined diameter. Note that as the mask, for example, polysilicon, titanium nitride, and so on can also be used, in addition to amorphous carbon.

In the plasma etching method according to the embodiment, plasma etching in a first step is performed first starting at the state shown in FIG. 1A. As the etching gas used in the first step, an etching gas is used which contains a fluorocarbon gas having a C/F ratio (a ratio of the number of carbon atoms/the number of fluorine atoms) higher (for example, $C_4F_6$ (C/F ratio=2/3)) than that in a later-described second step. Specifically, in addition to the fluorocarbon gas, a gas containing a rare gas and oxygen, for example, $C_4F_6/Ar/O_2$ is used as the etching gas.

Figure 1B:
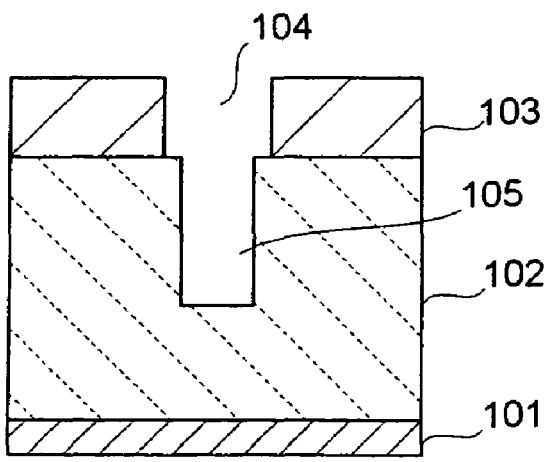
Figure 2:
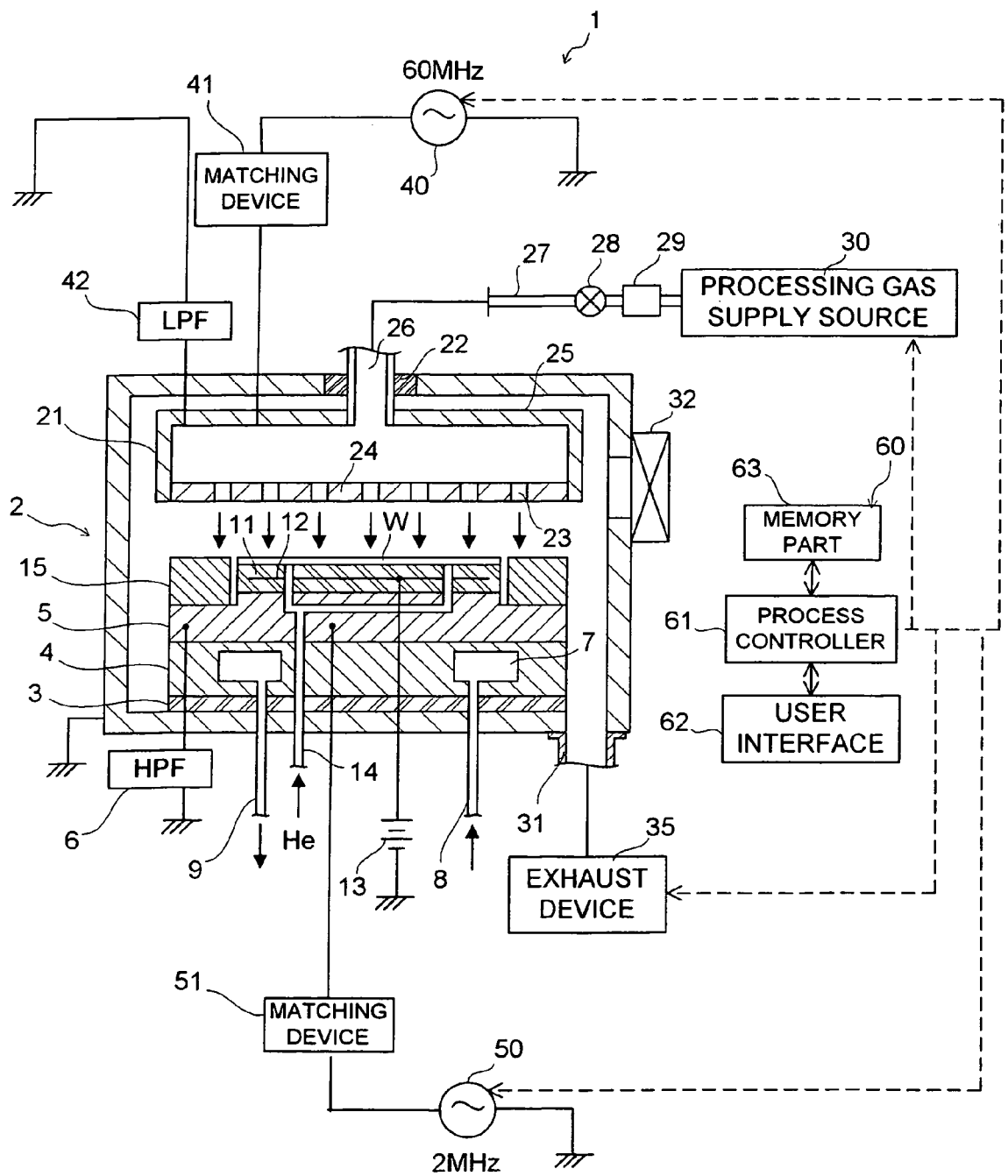
FIG. 2 is a diagram showing a schematic configuration of an etching apparatus according to the embodiment of the present invention.

By the plasma etching in the first step, a hole 105 is formed to a midpoint in the silicon oxide film 102 as shown in FIG. 1B. The depth of the hole 105 at this time is preferably on the order of 300 nm to 1000 nm and, more preferably, on the order of 700 nm to 800 nm when the thickness of the silicon oxide film 102 is, for example, on the order of 1800 nm. The hole 105 at this time comes to have a diameter slightly smaller than the opening diameter of the opening 104, but does not suffer from bowing.

Next, plasma etching in the second step is performed starting at the state shown in FIG. 1B. An etching gas used in the second step contains a fluorocarbon gas having a C/F ratio lower (for example, $C_4F_8$ (C/F ratio=1/2)) than that in the previously described first step. Specifically, in addition to the fluorocarbon gas, a gas containing a rare gas and oxygen, for example, $C_4F_8/Ar/O_2$ is used as the etching gas.

Figure 1C:
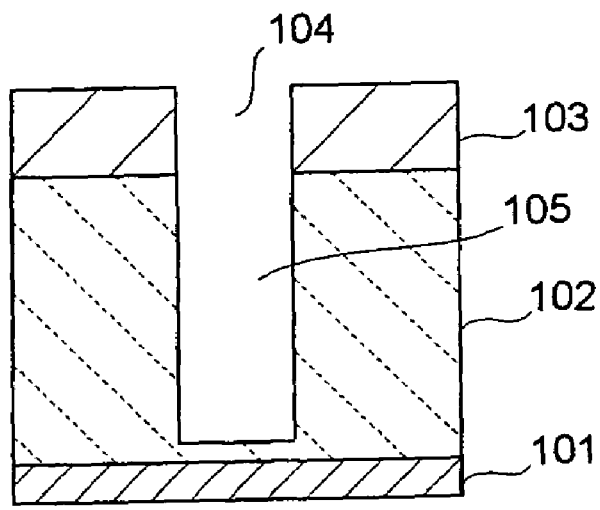
Figure 1D:
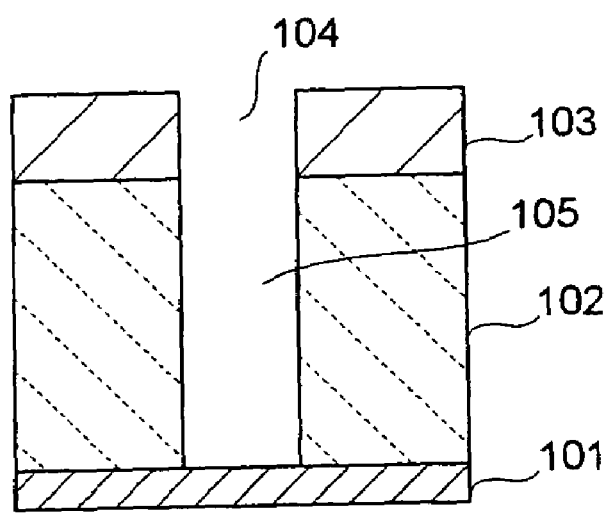

By the plasma etching in the second step, the silicon oxide film 102 is etched until the base SiN film 101 begins to be exposed or immediately before it is exposed as shown in FIG. 1C, so as to form the hole 105. At this time, the diameter of the hole 105 is almost the same as the opening diameter of the opening 104, and the etching in the depth direction reaches almost the bottom portion of the hole 105 without occurrence of bowing.

Thereafter, plasma etching in a third step (overetching) is performed starting at the state shown in FIG. 1C. An etching gas used in the third step contains a fluorocarbon gas having, similarly to the first step, a C/F ratio higher (for example, $C_4F_6$ (C/F ratio=2/3)) than that in the above-described second step. Specifically, in addition to the fluorocarbon gas, a gas containing a rare gas and oxygen, for example, $C_4F_6/Ar/O_2$ which is similar to that in the first step is used as the etching gas. This can ensure a selection ratio between the silicon oxide film 102 and the base SiN film 101.

As described above, the C/F atom number ratio of the fluorocarbon gas contained in the etching gas is controlled to be higher in the first step and the third step than that in the second step that exists therebetween, whereby the hole 105 in an excellent shape can be formed without occurrence of etch-stop and with less bowing, and the selection ratio between the silicon oxide film 102 and the base SiN film 101 can be ensured.

It should be noted that, in each of the above-described etching gases, Ar may be replaced with another rare gas, for example, Xe, He, Kr or the like. Further, CO may be added to each of the above-described etching gases. Furthermore, another fluorocarbon gas having a different C/F atom number ratio may be added to each of the above-described etching gases, in order to finely adjust the C/F atom number ratio. However, it is preferable not to use a hydro-fluorocarbon gas containing hydrogen. Moreover, it is possible to use, for example, $C_5F_8$ or the like as the fluorocarbon gas contained in the etching gas used in the first step and the third step, in addition to $C_4F_6$.

Beside, although the case of the etching in three steps has been described in the above, other steps may be added therebetween so that etching in four steps or more, for example, etching in five steps may be employed.

As an example 1, a contact hole (having an aspect ratio of 15) was actually formed, with the diameter of the opening 104 being 120 nm, under the following etching conditions, in the silicon oxide film (TEOS film) 102 with a thickness of 1800 nm on the semiconductor wafer W having the structure shown in FIGS. 1A to 1D using the plasma etching apparatus 1 shown in FIG. 2. Note that the processing recipe shown in the following is recorded on the memory part 63 or a recording medium and read from the memory part 63 or the recording medium in the control unit 60 of the plasma etching apparatus 1, so that the etching process following the recipe is executed.

(First Step)

An etching gas: $C_4F_6/Ar/O_2$=33/1000/33 sccm, a pressure was 3.4 Pa (25 mTorr), an electric power (upper portion/lower portion)=2400/2900 W, a temperature (upper portion/side wall portion/lower portion)=95/60/10° C., a cooling helium gas pressure (central portion/peripheral portion) =3990/6650 Pa (30/50 Torr), and a time period was 2 minutes.

(Second Step)

An etching gas: $C_4F_8/Ar/O_2$=40/760/30 sccm, a pressure was 3.4 Pa (25 mTorr), an electric power (upper portion/lower portion)=2300/4200 W, a temperature (upper portion/side wall portion/lower portion)=95/60/10° C., a cooling helium gas pressure (central portion/peripheral portion) =2660/5320 Pa (20/40 Torr), and a time period was 2 minutes.

(Third Step)

An etching gas: $C_4F_6/Ar/O_2$=43/800/49 sccm, a pressure was 3.4 Pa (25 mTorr), an electric power (upper portion/lower portion)=2600/3400 W, a temperature (upper portion/side wall portion/lower portion)=95/60/10° C., a cooling helium gas pressure (central portion/peripheral portion) =2660/3990 Pa (20/30 Torr), and a time period was 1 minute and 45 seconds.

As a result of this, a bowing value=(the hole diameter of the bowing portion−the hole diameter of the contact hole tip portion)×1/2 was 5.0 nm at the central portion of the semiconductor wafer W and 6.0 nm at the peripheral portion, resulting in that a contact hole in an excellent shape with less bowing could be formed.

It should be noted that when a similar contact hole was formed using an etching gas containing hydro-fluorocarbon such as $CH_2F_2$, $CHF_3$ or the like in the first step (main etching) as in the previously described prior art under conditions causing no etch-stop, the above-described bowing value was on the order of 20 nm. Accordingly, the occurrence of bowing could be restrained in the above example to 1/3 that in the prior art.

Figure 3A:
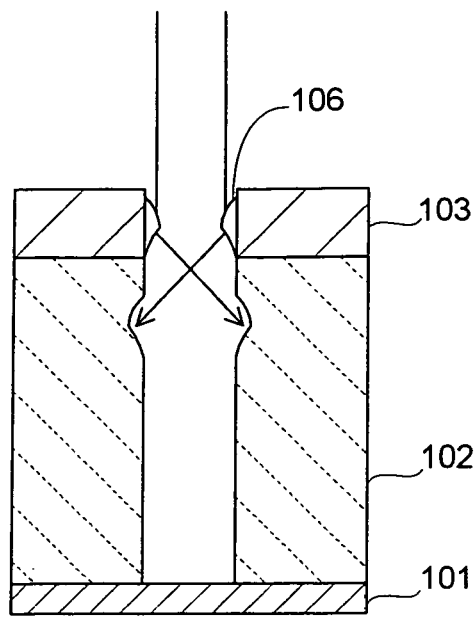
FIGS. 3A and 3B are views for explaining an experiment to verify the effect of the embodiment of the present invention.
Figure 3B:
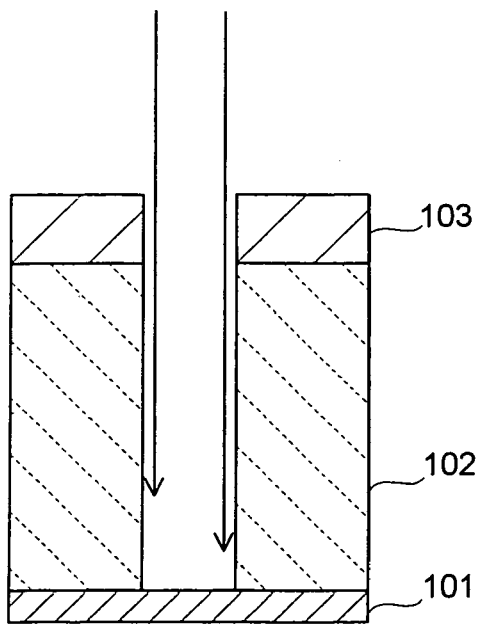

In order to verify the effect in the above-described example, the following experiment was conducted. FIGS. 3A and 3B are views showing a representative example of the experiment. FIG. 3A shows a case in which etching was performed only using the $C_4F_6/Ar/O_2$ gas, in which a reaction product 106 adheres to the side wall in the opening within the amorphous carbon film (mask) 103. It was verified that the reaction product 106 influences ions to deflect, so that the percentage of ions attacking the side wall in the silicon oxide film 102 increases, causing a large bowing shape. FIG. 3B shows a case in which etching was performed using the $C_4F_6/Ar/O_2$ gas to a midpoint and then the gas was changed with $C_4F_8/Ar/O_2$. There exists a very small amount of reaction product adhering to the side wall in the opening within the amorphous carbon film (mask) 103. Thus, it was verified that ions were not deflected and could enter down to the bottom of the hole 105, resulting in minimized bowing shape.

Furthermore, in the above-described example, etching was performed also in the cases in which the $C_4F_6$ flow rate of the etching gas used in the first step was decreased and increased by 2 sccm, and the cases in which the $O_2$ flow rate was decreased and increased by 2 sccm, and their bowing values were measured. As a result of this, the effect was verified also in such flow rate ranges, in which the bowing values were apt to be slightly greater than that in the above-described example but were significantly smaller than 20 nm in the prior art.

Furthermore, in the above-described example, etching was performed also in the cases in which the $C_4F_8$ flow rate of the etching gas used in the second step was decreased and increased by 2 sccm, and the cases in which the $O_2$ flow rate was decreased and increased by 2 sccm, and their bowing values were measured. As a result of this, the effect was verified also in such flow rate ranges, in which the bowing values were apt to be slightly greater than that in the above-described example but were significantly smaller than 20 nm in the prior art.

Furthermore, in the above-described example, etching was performed also in the cases in which the $C_4F_6$ flow rate of the etching gas used in the third step was decreased and increased by 2 sccm, and the cases in which the $O_2$ flow rate was decreased and increased by 2 sccm, and their bowing values were measured. As a result of this, the effect was verified also in such flow rate ranges, in which the bowing values were apt to be slightly greater than that in the above-described example but were significantly smaller than 20 nm in the prior art.

As described above, according to the embodiment, even a hole having a fine diameter and a high aspect ratio, in which a hole diameter is, for example, 0.13 μm or smaller and an aspect ratio is, for example, 15 or higher, can be formed in an excellent shape with occurrence of bowing restrained.

What is claimed is:

1. A plasma etching method of forming a hole by an etching process in a silicon oxide film through a mask, comprising:
    forming said silicon oxide film; and
    conducting an etching process through said mask using etching gases containing fluorocarbon gasses, respectively, under a condition that the fluorocarbon gas used in an initial period of the etching process and the fluorocarbon gas used in a final period of the etching process contain no hydrogen and contain oxygen, and the C/F ratios of the fluorocarbon gasses used in the initial period and the final period are within a range of 5/8-2/3, and a condition that the fluorocarbon gas used in an intermediate period of the etching process contains no hydrogen and contains oxygen, and the C/F ratio of the fluorocarbon gas used in the intermediate period is 1/2 or lower so as to form said hole with a diameter of 0.13 μm or smaller and an aspect ratio of 15 or higher in said silicon oxide film,
    wherein said mask is made of amorphous carbon.

2. A plasma etching method of forming a hole with a hole diameter of 0.13 μm or smaller in a silicon oxide film formed on a silicon nitride film, comprising:
    a first step of etching the silicon oxide film to a midpoint using an etching gas containing $C_4F_6$ or $C_5F_8$;
    after said first step, a second step of etching the silicon oxide film using an etching gas containing $C_4F_8$; and
    after said second step, a third step of performing overetching using an etching gas containing $C_4F_6$ or $C_5F_8$.

3. The plasma etching method as set forth in claim 2, wherein the etching gases used in said first step and third step comprise a mixed gas of $C_4F_6$ or $C_5F_8$ and an inert gas and oxygen, and
    wherein the etching gas used in said second step comprises a mixed gas of $C_4F_8$ and an inert gas and oxygen.

4. The plasma etching method as set forth in claim 2, wherein the etching gases used in said first step through third step contain no hydrogen.

5. The plasma etching method as set forth in claim 2, wherein said first step through third step are conducted via a mask made of amorphous carbon.

* * * * *